United States Patent [19]
Tanabe et al.

[11] Patent Number: 5,796,301
[45] Date of Patent: Aug. 18, 1998

[54] OFFSET CANCELLATION CIRCUIT

[75] Inventors: Ken Tanabe; Tadashi Nukui, both of Yokohama, Japan

[73] Assignee: Kabushiki Kaisha Toshiba, Kawasaki, Japan

[21] Appl. No.: 739,951

[22] Filed: Oct. 30, 1996

[30] Foreign Application Priority Data

Oct. 30, 1995 [JP] Japan .................................. 7-282205

[51] Int. Cl.$^6$ .................................................. H03F 3/45
[52] U.S. Cl. ................................................ 330/9; 330/69
[58] Field of Search .............................. 327/359; 330/9, 330/69, 51, 124 R, 252, 258

[56] References Cited

U.S. PATENT DOCUMENTS

| | | | |
|---|---|---|---|
| 4,633,223 | 12/1986 | Senderowicz | 330/9 X |
| 5,410,274 | 4/1995 | Birdsall et al. | 330/69 X |

OTHER PUBLICATIONS

Proc. IEEE ISCAS, pp. 1363–1366, 1991, P. Wu, et al., "Design Considerations For Common–Mode Feedback Circuits in Fully–Differential Operational Transconductance Apmplifiers With Tuning".

Primary Examiner—Steven Mottola
Attorney, Agent, or Firm—Oblon, Spivak, McClelland, Maier & Neustadt, P.C.

[57] ABSTRACT

An offset cancellation circuit of this invention includes operational amplifiers 11, 12 having fully differential outputs and common mode output, and comprises an adder 15 supplied with one $Vo^+1$ of the fully-differential outputs of the operational amplifier 11 and one $Vo^+2$ of the fully-differential outputs of the operational amplifier 12 to add them to output added result, an adder 16 supplied with the other $Vo^-1$ of the fully-differential outputs of the operational amplifier 11 and the other $Vo^-2$ of the fully-differential outputs of the operational amplifier 12 to add them to output added result, an adder 13 supplied with common mode output $Vcm1$ of the operational amplifier 11 and common mode output $Vcm2$ of the operational amplifier 12 to add them to output added result, and a multiplier 14 for multiplying an output of the adder 13 by ½ to output it. Thus, it is possible to eliminate influence of error resulting from offset quantities existing in respective common mode output potentials in plural operational amplifiers having fully-differential outputs.

8 Claims, 4 Drawing Sheets

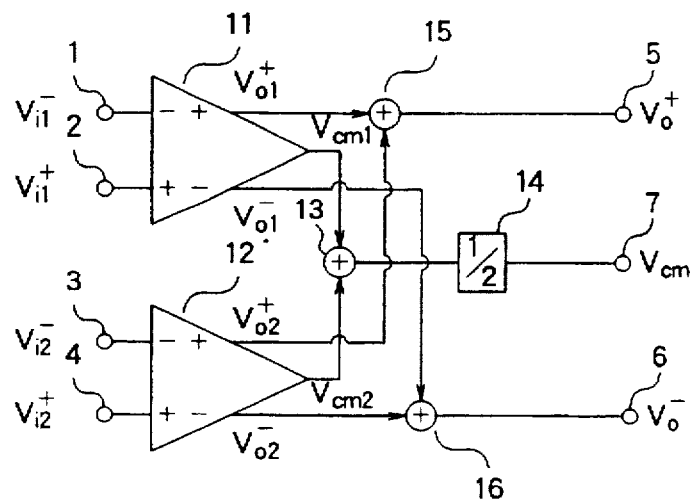
F I G. 2

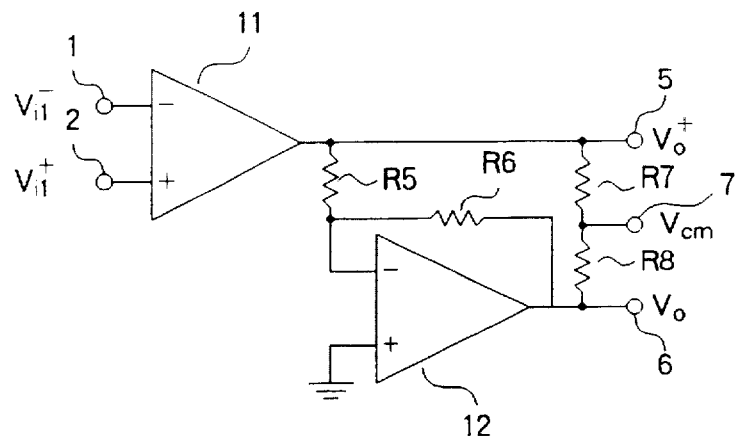
F I G. 6
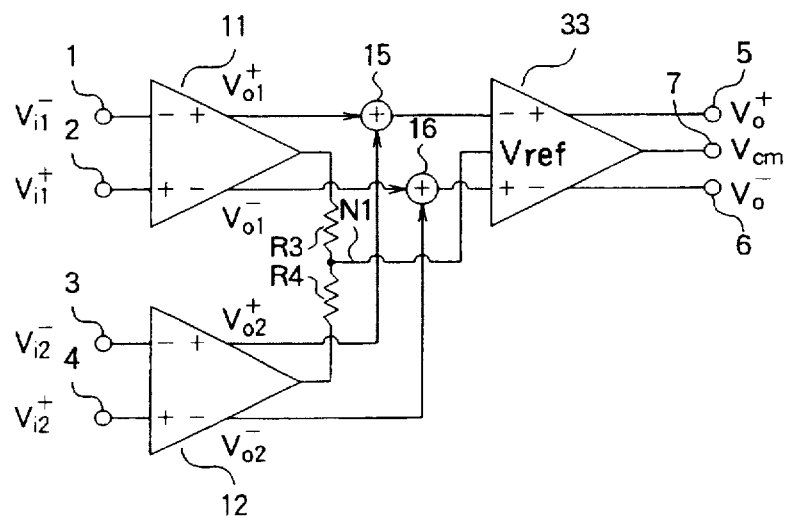
F I G. 7

5,796,301

1
OFFSET CANCELLATION CIRCUIT

BACKGROUND OF THE INVENTION

This invention relates to an offset cancellation circuit, and more particularly to an offset cancellation circuit suitable for a device adapted for carrying out processing of analog signals by operational amplifiers having fully-differential outputs.

In the analog signal processing, there are requirements such as improvement in supply voltage rejection ratio, expansion of the dynamic range, and reduction of harmonic distortion, etc. In view of this, in recent years, in order to cancel the influence of noise or drift, etc. included as DC component, operational amplifiers having differential outputs have been widely used.

The configuration of a conventional signal processing circuit having two operational amplifiers 21 and 22 is shown in FIG. 1. Signals $Vi^-1$, $Vi^+1$ inputted from external input terminals 1 and 2 are inputted to the inverting input terminal and the non-inverting input terminal of the operational amplifier 21, and are outputted therefrom as operation result signals $Vo^+1$ and $Vo^-1$, respectively. The signal $Vo^+1$ is inputted to an adder 23, and the signal $Vo^-1$ is inputted to an adder 24.

On the other hand, signals $Vi^-2$, $Vi^+2$ inputted from external input terminals 3 and 4 are inputted to the inverting input terminal and the non-inverting input terminal of the operational amplifier 22, and are outputted therefrom as operation result signals $Vo^+2$ and $Vo^-2$, respectively. The signal $Vo^+2$ is added to the adder 23, and the signal $Vo^-2$ is inputted to the adder 24. Thus, the signal $Vo^+1+Vo^+2$ is outputted as a signal $Vo^+$ from the adder 23 to the external. The signal $Vo^-1+Vo^-2$ is outputted as a signal $Vo^-$ from the adder 24 to the external.

However, there was the following problem in such conventional signal processing circuit.

In the above-described operational amplifiers 21 and 22 having fully-differential outputs, respective common mode output potentials Vcm1 and Vcm2 are apt to become unstable, and offset quantities exist in respective potentials. In this case, $Vo^+1=Vd1+Vcm1$, $Vo^-1=Vd1+Vcm1$, $Vo^+2=Vd2+Vcm2$, and $Vo^-2=Vd2+Vcm2$. The offset quantities are potential differences that Vcm1 and Vcm2 have with respect to the ideal common mode potential Vcm.

As the prior art, there is also a circuit as disclosed, e.g., in the "Proc. IEEE ISCAS 1991 pp. 1363–1366" in which, for the purpose of stabilizing the common mode output potential, a path for providing feedback of this potential is provided. However, in the case where such conventional feedback path is added, the common mode output potential becomes stable, but offset quantities that respective common mode outputs include cannot be canceled. As a result, it is difficult to precisely set the absolute value. Particularly, in the case where circuits of plural analog signal processing systems are formed on the same chip, characteristics of respective elements change resulting from unevenness (variations) in the production (manufacturing) process, particularly, offset quantities that the common mode outputs of respective elements include vary to much degree. As a result, in the case where outputs of plural signal processing systems are caused to undergo additive or subtractive operation to provide an output thus combined, difference between offset quantities included in respective common mode output potentials would directly result in error of the processing result.

SUMMARY OF THE INVENTION

Accordingly, an object of this invention is to provide an offset cancellation circuit including a plurality of operational amplifiers having fully differential outputs, and capable of canceling offset quantities existing in respective common mode output potentials.

In accordance with this invention, there is provided an offset cancellation circuit including a plurality of operational amplifiers each having fully-differential outputs and a common mode output, the circuit comprising a first operation element supplied with one outputs of the respective fully-differential outputs of the operational amplifiers to perform a predetermined operation to output an operation result, a second operation element supplied with the other outputs of the respective fully-differential outputs of the operation amplifiers to perform a predetermined operation to output an operation result, and a third operational element supplied with respective common mode outputs of the operational amplifiers to output an average value thereof.

In this circuit, respective common mode outputs of the plural operational amplifiers are inputted to the third operation element, so an averaged value is outputted. Thus, offset quantities included in the respective common mode outputs are canceled.

Another circuit of this invention is directed to an offset cancellation circuit including first and second operational amplifiers each having fully-differential outputs and a common mode output, the circuit comprising a first operation element supplied with one of the fully-differential outputs of the first operational amplifier and one of the fully-differential outputs of the second operation amplifier to perform a predetermined operation to output an operation result, a second operation element supplied with the other of the fully-differential outputs of the first operation amplifier and the other of the fully-differential outputs of the second operational amplifier to perform a predetermined operation to output an operation result, an adder supplied with the common mode output of the first operational amplifier and the common mode output of the second operational amplifier to add them to output an added result, and a multiplier for multiplying the added result that the adder has outputted by a predetermined value to output it.

A further offset cancellation circuit of this invention comprises a first adder connected to a first fully-differential output terminal of a first operational amplifier and a first fully-differential output terminal of a second operational amplifier, and respectively supplied with one outputs of the fully-differential outputs from the first and second operational amplifiers to add them to output an added result, a second adder connected to a second fully-differential output terminal of the first operational amplifier and a second fully-differential output of the second operational amplifier, and respectively supplied with the other outputs of the fully-differential outputs from the first and second operational amplifiers to add them to output an added result, and first and second resistors connected in series between a common mode output terminal of the first operational amplifier and a common mode output terminal of the second operational amplifier, and adapted so that an averaged common mode output is produced from the junction of the first and second resistors.

A still further offset cancellation circuit of this invention comprises a first operational amplifier respectively supplied at the inverting input terminal and the non-inverting input terminal with first and second signals from the external to produce one of the fully-differential outputs from an output terminal, an inverting amplifier having an input terminal connected to the output terminal of the first operational amplifier, and supplied with the one of the fully-differential

3 outputs to carry out inverting operation to produce the other of the fully-differential outputs from an output terminal, and a common mode output producing section connected between the output terminal of the first operational amplifier and the output terminal of the inverting amplifier, and supplied with the one of the fully-differential outputs that the first operation amplifier has produced and the other of the fully-differential outputs that the inverting amplifier has produced to produce a common mode output corresponding to the intermediate potential thereof.

A still more further offset cancellation circuit of this invention includes first, second and third operational amplifiers each having fully-differential outputs and a common mode output, the circuit comprising a first adder connected to a first fully-differential output terminal of the first operational amplifier and a first fully-differential output terminal of the second operational amplifier, and respectively supplied with one outputs of the fully-differential outputs from the first and second operational amplifiers to add them to output an added result, a second adder connected to a second fully differential output terminal of the first operational amplifier and a second fully-differential output terminal of the second operational amplifier, and respectively supplied with the other outputs of the fully-differential outputs from the first and second operational amplifiers to add them to output an added result, and a reference potential generator connected to a common mode output terminal of the first operational amplifier and a common mode output terminal of the second operational amplifier, and respectively supplied with common mode outputs to average them to output an averaged value as a reference potential, the third operational amplifier being such that the inverting input terminal and the non-inverting input terminal are respectively connected to respective output terminals of the first and second adders, and that a reference potential terminal is connected to an output terminal of the reference potential generator, the third operational amplifier being supplied with the reference potential that the reference potential generator has generated and respective outputs of the first and second adders to produce fully-differential outputs and a common mode output.

In this case, common mode outputs of the respective operational amplifiers may be taken out from the junction of two resistors connected in series between two terminals from which fully-differential outputs are produced.

BRIEF DESCRIPTION OF THE DRAWINGS

FIG. 2 is a circuit diagram showing the configuration of an offset cancellation circuit according to a first embodiment of this invention.

FIG. 6 is a circuit diagram showing the configuration of an offset cancellation circuit according to a third embodiment of this invention.

FIG. 7 is a circuit diagram showing the configuration of an offset cancellation circuit according to a fourth embodiment of this invention.

4

DESCRIPTION OF THE PREFERRED EMBODIMENTS

Figure 1:
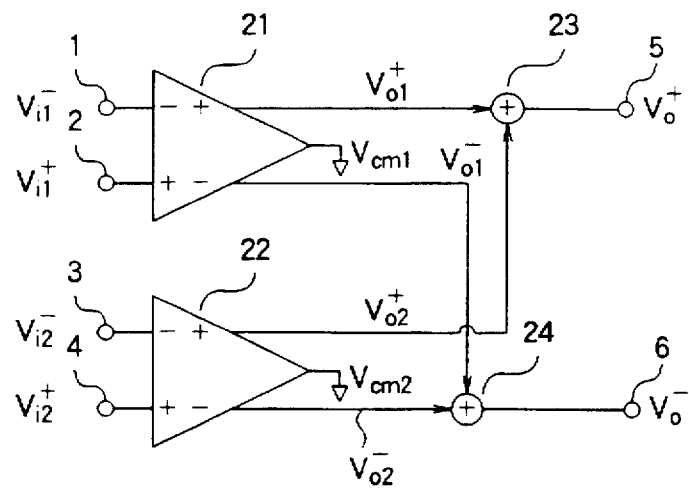
FIG. 1 is a circuit diagram showing the configuration of a conventional offset cancellation circuit.

Preferred embodiments of this invention will now be described with reference to the attached drawings.

The configuration of an offset cancellation circuit according to the first embodiment of this invention is shown in FIG. 2. This circuit comprises two operational amplifiers 11 and 12 each having fully-differential outputs and a common mode output, adders 15 and 16 for adding respective fully-differential outputs, an adder 13 for adding respective common mode outputs, and a multiplier 14 for multiplying an output of the adder 13 by ½.

External input terminals 1 and 2 supplied with input signals $Vi^-1$ and $Vi^+1$ are respectively connected to the inverting input terminal and the non-inverting input terminal of the operational amplifier 11, and external input terminals 3 and 4 supplied with input signals $Vi^-2$ and $Vi^+2$ are respectively connected to the inverting input terminal and the non-inverting input terminal of the operational amplifier 12. Respective non-inverting outputs $Vo^+1$, $Vo^+2$ of the operational amplifiers 11 and 12 are inputted to the adder 15. An added result thus obtained is outputted from an external output terminal 5 as an output $Vo^+$. Similarly, inverting outputs $Vo^-1$, $Vo^-2$ of the operational amplifiers 11 and 12 are inputted to the adder 16. An added result thus obtained is outputted from an external output terminal 6 as an output $Vo^-$.

Further, respective common mode outputs Vcm1, Vcm2 of the operational amplifiers 11 and 12 are inputted to the adder 13, at which they are added. An added result thus obtained is delivered to the multiplier 14, at which the added result is multiplied by ½. As a result, (Vcm1+Vcm2)/2 is outputted from an external output terminal 7 to the external as the common mode output Vcm of the circuit.

As stated above, in accordance with this embodiment, output (Vcm1+Vcm2)/2 obtained by averaging respective common mode output potentials of the plural operational amplifiers 11 and 12 is used as the common mode output potential Vcm of the entire circuit. Thus, offset quantities are canceled in values obtained by allowing fully-differential outputs $Vo^+1$ and $Vo^-1$, $Vo^+2$ and $Vo^-2$ of the operational amplifiers 21 and 22 to undergo additive or subtractive operation, and are completely eliminated.

The offset cancellation circuit of the first embodiment cancels offset quantities existing in common mode outputs of the operational amplifiers in the two analog signal processing systems.

Figure 3:
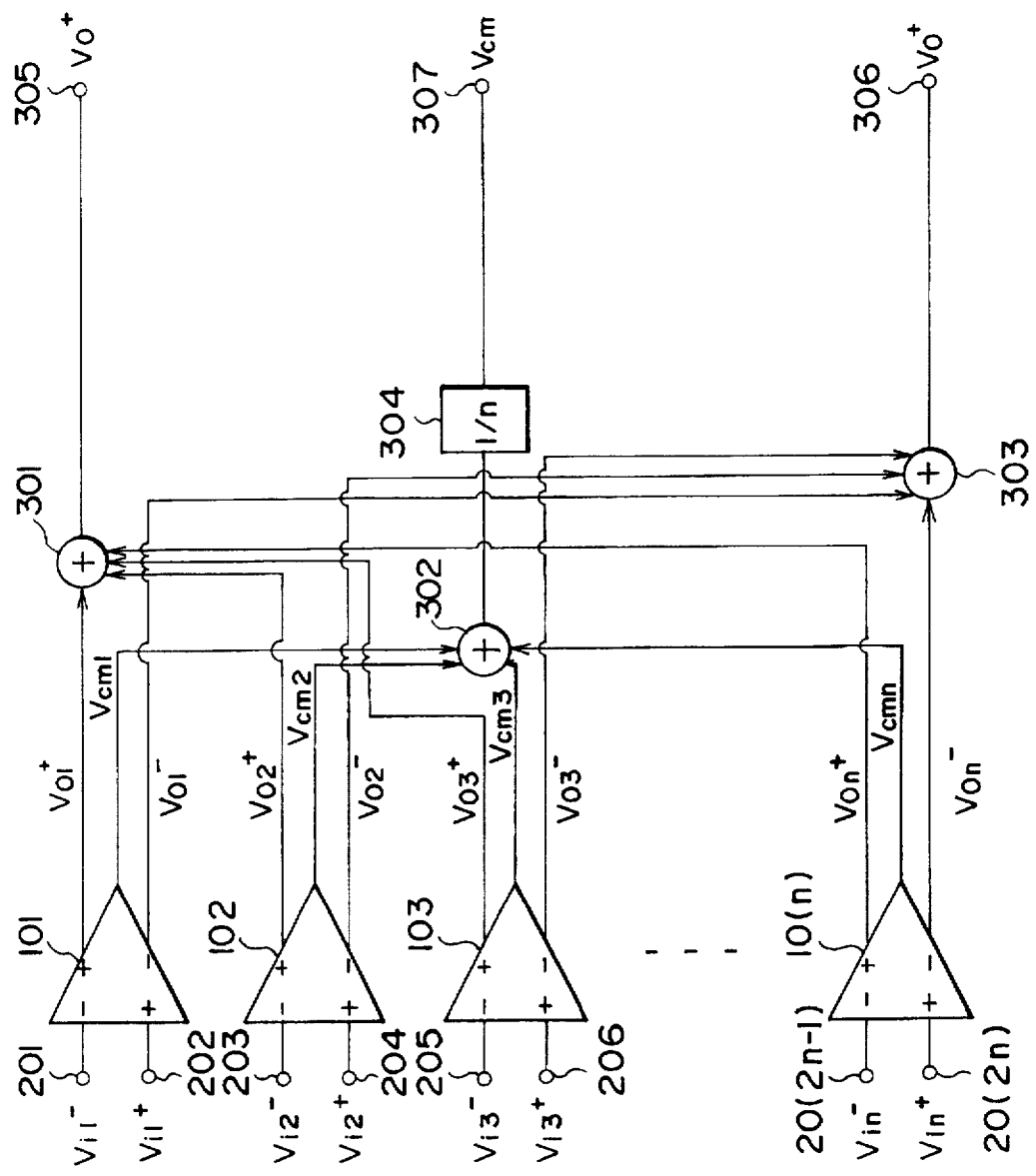
FIG. 3 is a circuit diagram showing the configuration of a modified example of the offset cancellation circuit according to the first embodiment.

However, also in the case where n number of analog signal processing systems (n is integer equal to 2 or more) are provided, this invention can be similarly applied. The circuit configuration in this case is shown in FIG. 3. In this circuit configuration, n number of operational amplifiers 101~10(n) are provided. External input terminals 201 and 202, 203 and 204, . . . , 20 (2n-1) and 20 (2n) are connected to the inverting input terminals and the non-inverting input terminals of the respective operational amplifiers 101 to 10(n), and input signals $Vi^-1$ and $Vi^+1$, $Vi^-2$ and $Vi^+2$, $Vi^-3$ and $Vi^+3$, . . . , $Vi^-n$ and $Vi^+n$ are inputted. Respective non-inverting outputs $Vo^+1$, $Vo^+2$, $Vo^+3$, . . . , $Vo^+n$ of the operational amplifiers 101 to 10(n) are inputted to an adder 301. Thus, an added result $Vo^+$is outputted. Respective inverting outputs $Vo^-1$, $Vo^-2$, $Vo^-3$, . . . , $Vo^-n$ of the operational amplifiers 101 to 10(n) are inputted to an adder 303. Thus, an added result $Vo^-$is outputted. Further, respective common mode outputs Vcm1, Vcm2, Vcm3, . . . Vcmn of the operational amplifier 101 to 10(n) are inputted to an adder 302. Thus, an added result is outputted. This added result is inputted to a multiplier 304, at which it is multiplied by 1/n. Thus, common mode output Vcm is outputted.

In the case where n number of operational amplifiers are used, the relationship as described below exists. Assuming now that output of the first operational amplifier is Vo1, output of the second operational amplifier is Vo2, . . . . , output of the n-th operational amplifier is Von, differential output components are $\pm Vd1$, $\pm Vd2$, . . . . , $\pm Vdn$ in order, and common mode output components are Vc1, Vc2, . . . , Vcn in order, the relationship as described below holds:

$$Vo1 = Vd1 + Vc1, -Vo1 = -Vd1 + Vc1 \quad (1)$$
$$Vo2 = Vd2 + Vc2, -Vo2 = -Vd2 + Vc2 \quad (2)$$

$$Von = Vdn + Vcn, -Von = -Vdn + Vcn \quad (3)$$

When it is further assumed that an average value of the common mode output components is Vcm (=(Vc1+Vc2+. . .+Vcn)/n) and DC offset voltages with respect to the average value Vcm are respectively Vos1, Vos2, . . . , Vosn, the following relationship holds.

$$Vo1 = Vd1 + Vcm + Vos1, -Vo1 = -Vd1 + Vcm + Vos1 \quad (4)$$
$$Vo2 = Vd2 + Vcm + Vos2, -Vo2 = -Vd2 + Vcm + Vos2 \quad (5)$$

$$Von = Vdn + Vcm + Vosn, -Von = -Vdn + Vcm + Vosn \quad (6)$$

Now, when all DC offset voltages Vos1 to Vosn are totalized, the sum total becomes equal to zero as indicated below.

$$\sum_{i=1}^{n} Vosi = \sum_{i=1}^{n}(Vci - Vcm) = Vc1 + Vc2 + \ldots + Vcn - n \cdot Vcm = 0 \quad (7)$$

As stated above, in the case where signals of plural analog signal processing systems are added, when the average value Vcm of common mode output voltages is used as the common mode input voltage, i.e., reference potential, DC offset voltages included in common mode outputs of respective operational amplifiers can be completely canceled.

Figure 4:
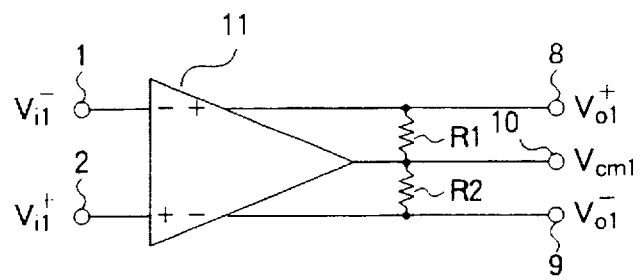
FIG. 4 is a circuit diagram showing the configuration for taking out common mode output by operational amplifier 11 in the offset cancellation circuit according to the first embodiment.

Common mode outputs of the operational amplifiers 11, 12 in the first embodiment can be obtained by a configuration as shown in FIG. 4, for example. Resistors R1 and R2 having the same resistance value are connected in series between internal terminals 8, 9 from which fully-differential outputs Vo$^+$1, Vo$^-$1 are respectively outputted of the operational amplifier 11. Thus, common mode output Vcm1 can be taken out from an internal terminal 10 connected to the node connecting the resistors R1 and R2.

Figure 5:
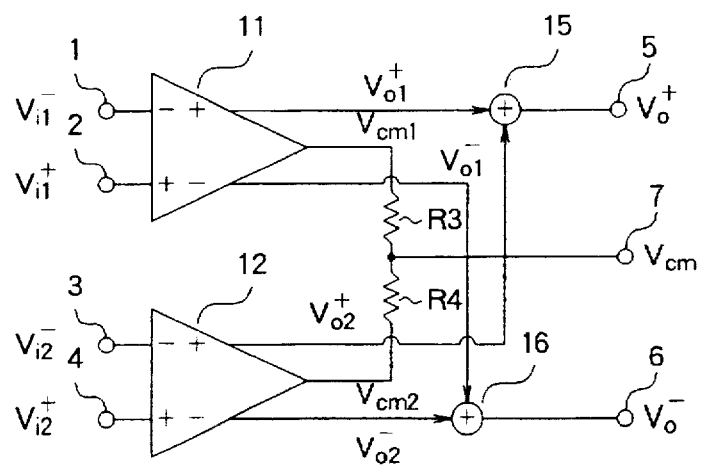
FIG. 5 is a circuit diagram showing the configuration of an offset cancellation circuit according to a second embodiment of this invention.

An offset cancellation circuit according to the second embodiment of this invention has a configuration as shown in FIG. 5. In the above-described first embodiment, common mode output Vcm1 of the operational amplifier 11 and common mode output Vcm2 of the operational amplifier 12 are added by the adder 13. An added result thus obtained is multiplied by ½ by the multiplier 14 to obtain common mode output Vcm. On the contrary, in this embodiment, the common mode output terminal of the operational amplifier 11 and the common mode output terminal of the operational amplifier 12 are connected by resistors R3 and R4 having the same resistance value and connected in series. Thus, common mode output Vcm is taken out from external output terminal 7 connected to the connection node. Since other components are the same as those of the first embodiment, their explanation is omitted.

The configuration of an offset cancellation circuit according to the third embodiment of this invention is shown in FIG. 6. This embodiment is characterized in that an output of one operational amplifier is inverted by the other operational amplifier to thereby obtain fully-differential outputs, and common mode output is produced by voltage division by resistor from the fully-differential outputs.

The inventing input terminal and the non-inverting input terminal of the operational amplifier 11 are respectively connected to external input terminals 1 and 2, and external output terminal 5 is connected to the output terminal of the operational amplifier 11. Moreover, the inverting input terminal of the operational amplifier 12 is connected to the output terminal of the operational amplifier 11 through a resistor R5. The inverting input terminal is connected to the output terminal of the operational amplifier 12 through a resistor R6. The output terminal of the operational amplifier 12 is connected to the external output terminal 6, and the non-inverting input terminal is grounded. Further, resistors R7 and R8 are connected in series between the external output terminals 5 and 6, and the external output terminal 7 is connected to the junction of the resistors 7 and 8.

Since the offset cancellation circuit of this embodiment is caused to be of such a configuration, one potential Vo+of fully-differential outputs is outputted from the operational amplifier 11 through the external output terminal 5, and potential Vo$^-$inverted by the inverting amplifier composed of resistors R5, R6 and the operational amplifier 12 is outputted from the external output terminal 6. Further, common mode output Vcm is outputted from the external output terminal 7.

The configuration of an offset cancellation circuit according to the fourth embodiment of this invention is shown in FIG. 7. Since the configuration composed of operational amplifiers 11 and 12, resistors R3 and R4, and adders 15 and 16 is the same as the configuration of the second embodiment shown in FIG. 3, its explanation is omitted. The fourth embodiment is characterized in that respective fully-differential outputs Vo$^+$and Vo$^-$of the adders 15 and 16 are inputted to the inverting input terminal and the non-inverting input terminal of an operational amplifier 33 of the succeeding stage, and the common mode output Vcm outputted from the connection node N1 of the resistors R3 and R4 is inputted to the operational amplifier 33 as reference potential Vref.

By such a configuration, it is possible to obtain, in this embodiment, common mode output Vcm in which offset quantities that fully-differential outputs Vo$^+$and Vo$^-$from the operational amplifier 33 of the succeeding stage and common mode outputs Vcm1 and Vcm2 of the operational amplifiers 11 and 12 of the preceding stage include are canceled.

The above-described embodiments are presented only for illustrative purpose. Therefore, it should not be interpreted that those embodiments limit this invention in any sense, and various modifications may be made within the range which does not depart from the scope of the right of this invention. For example, while two operational amplifiers are all used in the second, third and fourth embodiments, three operational amplifiers or more may be used. Moreover, in the modified example of the first embodiment shown in FIG. 3, one potentials Vo$^+$1, Vo$^+$2, . . . , Vo$^-$n of fully-differential outputs of n number of operational amplifiers are all added by one adder, and the other potentials Vo$^-$1, Vo$^-$2, . . . , Vo$^-$n of fully-differential outputs of the operational amplifiers are all added by the other adder to add all of common mode outputs Vcm1, Vcm2, . . . , Vcmn to output a value obtained by multiplying the added result by 1/n. However, an approach may be employed to allow several ones of one voltages of the fully differential outputs to undergo subtractive operation (e.g., $Vo^+1+Vo^+2-Vo^+3-Vo^+4+\ldots -Vo^+n$), and to allow several ones of the other voltages of the fully-differential outputs to undergo subtractive operation (e.g., $Vo^-1+Vo^-2-Vo^-3-Vo^-4+\ldots -Vo^-n$) to add all of respective common mode outputs Vcm1, Vcm2, ..., Vcmn to output a value obtained by multiplying the added result by 1/n.

What is claimed is:

1. An offset cancellation circuit including a plurality of operational amplifiers each having first and second fully-differential outputs and a common mode output, the circuit comprising:

a first operational element connected to the first fully-differential output of each operational amplifier to perform a predetermined operation to output a first operation result;

a second operation element connected to the second fully-differential output of each operational amplifier to perform a predetermined operation to output a second operation result; and a third operation element connected to the common mode ouput of each operational amplifier to output an average value of the common mode outputs.

2. An offset cancellation circuit as set forth in claim 1, further comprising:

first and second resistors connected in series between the first and second fully-differential outputs of each operational amplifier of the plurality of the operational amplifiers, the common mode output of each operational amplifier connected to a node between the respective resistors connected thereto, each of said nodes connected to the third operation element.

3. An offset cancellation circuit including first and second operational amplifiers each having first and second fully-differential outputs and a common mode output, the circuit comprising:

a first operation element supplied with the first fully-differential output of the first operational amplifier and the first fully-differential output of the second operational amplifier to perform a predetermined operation to output an operation result;

a second operation element supplied with the second fully-differential output of the first operational amplifier and the second fully-differential output of the second operational amplifier to perform a predetermined operation to output an operation result;

an adder supplied with the common mode output of the first operational amplifier and the common mode output of the second operational amplifier to add the common mode outputs of the first and second operational amplifiers to output an added result thereof; and a multiplier for multiplying the added result that the adder has outputted by a predetermined value to output a multiplication result.

4. An offset cancellation circuit as set forth in claim 3, wherein said adder and said multiplier comprise:

plural resistors, each having one end connected to a common node and another end connected to a common mode output of a respective operational amplifier.

5. An offset cancellation circuit including first and second operational amplifiers each having first and second fully-differential ouput terminals and a common mode output terminal, the circuit comprising:

a first adder connected to the first fully-differential output terminal of the first operational amplifier and the first fully-differential output terminal of the second operational amplifier, and respectively supplied with a first fully-differential output from each of the first and second operational amplifiers to add the first fully-differential outputs to output an added result;

a second adder connected to the second fully-differential output terminal of the first operational amplifier and the second fully-differential output terminal of the second operational amplifier, and respectively supplied with a second fully-differential output from each of the first and second operational amplifiers to add the second fully-differential outputs to output an added result; and first and second resistors connected in series between the common mode output terminal of the first operational amplifier and the common mode output terminal of the second operational amplifier such that an averaged common mode output is produced from a node connecting the first and second resistors.

6. An offset cancellation circuit comprising:

a first operational amplifier having an inverting input terminal and a non-inverting input terminal which receive respective first and second external signals to produce a first fully-differential output at an output terminal of the first operational amplifier;

an inverting amplifier having an input terminal coupled to the first output terminal of the first operational amplifier and supplied with the first fully-differential output to carry out an inverting operation to produce a second fully-differential output from an output terminal of the inverting amplifier; and a common mode output producing section connected between the output terminal of the first operational amplifier and the output terminal of the inverting amplifier, and respectively supplied with fully-differential outputs that the first operational amplifier has produced and that the inverting amplifier has produced to produce a common mode output corresponding to an intermediate potential between the fully-differential output of the first operational amplifier and the fully-differential output of the inverting amplifier.

7. An offset cancellation circuit comprising:

first, second and third operational amplifiers each having first and second fully-differential output terminals and a common mode output terminal;

a first adder connected to the first fully-differential output terminal of the first operational amplifier and the first fully-differential output terminal of the second operational amplifier, and respectively supplied with a first fully-differential output from each of the first and second operational amplifiers to output an added result at an output terminal of said first adder;

a second adder connected to the second fully-differential output terminal of the first operational amplifier and the second fully-differential output terminal of the second operational amplifier, and respectively supplied with a second fully-differential output from each of the first and second operational amplifiers to output an added result at an output terminal of said second adder; and a reference potential generator having a first input coupled to the common mode output terminal of the first operational amplifier, a second input coupled tothe common mode output terminal of the second operational amplifier, and an output terminal, said first and second inputs receiving a common mode output from respective of the first and second operational amplifiers to average the common mode outputs of the first and second operational amplifiers to output an averaged value as a reference potential, the third operational amplifier comprising an inverting input terminal connected to the output terminal of the first adder, a non-inverting input terminal connected to the output terminal of the second adder, and a reference potential input terminal connected to the output terminal of the reference potential generator, the third operational amplifier being supplied with the reference potential that the reference potential generator has generated and respective outputs of the first and second adders to produce fully-differential outputs and a common mode output.

8. An offset cancellation circuit as set forth in claim 7, wherein the reference potential generator comprises:

plural resistors, each having one end connected to a common node and another end connected to the common mode output terminal of a respective operational amplifier.

* * * * *